United States Patent [19]

Bottka et al.

[11] Patent Number: 4,524,090
[45] Date of Patent: Jun. 18, 1985

[54] DEPOSITION OF COMPOUNDS FROM MULTI-COMPONENT ORGANO-METALS

[75] Inventors: Nicholas Bottka, Burke, Va.; Robert W. Schwartz; Wayne E. Thun, both of Ridgecrest, Calif.

[73] Assignee: The United States of America as represented by the Secretary of the Navy, Washington, D.C.

[21] Appl. No.: 605,712

[22] Filed: Apr. 30, 1984

[51] Int. Cl.$^3$ ............................................. B05D 3/06
[52] U.S. Cl. ..................................... 427/53.1; 427/87
[58] Field of Search ............... 427/53.1, 54.1, 55.1, 427/87, 226; 156/613

[56] References Cited

U.S. PATENT DOCUMENTS

| | | |
|---|---|---|
| 3,061,464 | 10/1962 | Norman et al. |
| 3,061,465 | 10/1962 | Norman et al. |
| 3,692,652 | 9/1972 | Seyferth et al. ................ 204/158 R |
| 4,066,481 | 1/1978 | Manasevit ............................ 148/174 |
| 4,141,778 | 2/1979 | Domrachev et al. ............... 156/613 |
| 4,147,571 | 3/1979 | Stringfellow et al. ............. 148/175 |
| 4,250,205 | 2/1981 | Constant et al. ....................... 427/87 |
| 4,324,854 | 4/1982 | Beauchamp et al. ............... 430/296 |
| 4,332,879 | 6/1982 | Pastor et al. ......................... 430/272 |
| 4,340,617 | 7/1982 | Deutsch et al. .................... 427/53.1 |
| 4,360,542 | 11/1982 | Loeffler et al. ..................... 427/226 |
| 4,447,469 | 5/1984 | Peters ..................................... 427/87 |

OTHER PUBLICATIONS

Coates et al., "Organometallic Compounds", vol. one, Methuen & Co. Ltd., London, 3rd Ed., 1967, pp. 136, 147, 155.

Primary Examiner—John H. Newsome
Attorney, Agent, or Firm—Robert F. Beers; W. Thom Skeer; Bruce H. Cottrell

[57] ABSTRACT

A method of preparing films having the formula $A^{IIB}B^{VIA}$ wherein $A^{IIB}$ is a group IIB metal and $B^{VIA}$ is a chalcogenide by the photolysis or low temperature thermolysis of an organo-metallic compound containing the targeted $A^{IIB}B^{VIA}$ elements is provided. Organo-metallic compounds utilized in the method are of the general formulas R-X-M-X-R', R-M-X-M-R', R-M-X-R', R-M-CH$_2$-X-R', R-M-X-X-R' wherein R and R' are hydrogen, an alkyl, an aryl or an organic radical containing a heteroatom, M is a group IIB metal and X is a chalcogenide. Photolysis is carried out with an ultraviolet, visible or infrared light source. The films are useful in the manufacture of semiconductor elements and optical coatings.

6 Claims, No Drawings

DEPOSITION OF COMPOUNDS FROM MULTI-COMPONENT ORGANO-METALS

BACKGROUND OF THE INVENTION

1. Field of the Invention

This invention relates to the preparation of temperature sensitive II–VI semiconductors by the decomposition via photolysis or low temperature thermolysis or pyrolysis of organo-metallic compounds.

2. Description of the Prior Art

Thin metal films have been produced by conventional techniques such as vacuum deposition and electron/ion beam sputtering. These techniques are high temperature procedures and are non-selective in the materials deposited. Chemical vapor deposition using organo-metallic compounds has found increased application in the preparation of metal, semiconductor and insulating films. These deposition techniques are important in microelectronics, optoelectronics and optics.

In conventional organo-metallic chemical vapor deposition, high temperatures are used to initiate the chemical reaction near or on a substrate on which the desired film is to be deposited. Typically, elemental or compound species are used in the deposition. In the deposition of the compound species GaAs, at least two chemical species have been used, such as trimethyl gallium and arsine or trimethyl gallium and trimethyl arsenic.

The multiple source process does not always allow the simple control of the stoichiometry of the deposited film. This problem can be magnified when one of the chemical constituents is more volatile than the other such as in the deposition of HgTe. Other difficulties encountered with the high temperature pyrolysis method include thermally aided diffusion between the film and the substrate, incorporation of impurities into the film, and undesired film morphology.

One low temperature deposition technique has been described by Johnson et al., Appl. Physics Lett. 40, 798 (1982). Thin films of Zn, Se and non-stoichiometric ZnSe were produced by photodissociation of $Zn(CH_3)_2$ and $Se(CH_3)_2$. As in the high temperature process, stoichiometry of the film is not easily controlled.

SUMMARY OF THE INVENTION

The present invention has overcome some of the previous problems by incorporating the desired target molecule to be deposited directly into the organo-metallic compound. The target molecule is chemically bonded within the organo-metallic compound until released by the breaking of the organo-metallic bonds. A film having the formula $A^{IIB}B^{VIA}$ wherein $A^{IIB}$ is a group IIB metal and $B^{VIA}$ is a chalcogenide is deposited upon a substrate by exposing the substrate to an environment containing a decomposable organo-metallic compound selected from the group consisting of R-X-M-X-R', R-M-X-M-R', R-M-X-R', R-M-CH$_2$-X-R' and R-M-X-X-R' wherein: R and R' are each selected from the group consisting of hydrogen, an organic radical such as an alkyl or an aryl and an organic radical containing a heteroatom; M is a group IIB metal; and X is a chalcogenide, followed by decomposing the organo-metallic compound through photolysis or low temperature thermolysis or pyrolysis to deposit a film including the target molecule that was within the organo-metallic compound.

OBJECTS OF THE INVENTION

It is an object of this invention to provide a method of depositing a film of the formula $A^{IIB}B^{VIA}$ by photolysis of a single organo-metallic compound at low or ambient temperatures.

Another object of this invention is to provide a method of depositing the film by the low temperature pyrolysis or thermolysis in the range of 50°–100° C.

These and other objects, advantages and novel features of the present invention will become apparent from the following detailed description.

DESCRIPTION OF THE PREFERRED EMBODIMENT

The invention pertains to methods of depositing a film or layer upon a substrate or other target surface. Group II-VI semiconductors may successfully be deposited by photolysis or low temperature pyrolysis or thermolysis of selected organo-metallic compounds. Low temperature pyrolysis or thermolysis includes temperatures up to 100° C. Photolysis is accomplished by the use of ultraviolet, visible or infrared light sources.

The films deposited by this method are of the formula $A^{IIB}B^{VIA}$ wherein $A^{IIB}$ is a group IIB metal such as zinc, cadmium or mercury and $B^{VIA}$ is a chalcogenide such as sulfur, selenium or tellurium. The organo-metallic compounds utilized by this method contain the desired target molecule, $A^{IIB}B^{VIA}$. The target molecule can be chemically bonded within the organo-metallic compound until released by the breaking of the organo-metallic bonds. The desired organo-metallic compounds include R-X-M-X-R', R-M-X-M-R', R-M-X-R', R-M-CH$_2$-X-R' and R-M-X-X-R' wherein R and R' can be hydrogen, an organic radical such as an alkyl, an aryl or an organic radical containing a heteroatom, M is a group IIB metal and X is a chalcogenide. Heteroatom refers to atoms other than carbon atoms such as a silicon atom.

The method of this invention does not require the high temperatures of many previous methods to effect deposition of the film layer. While the organo-metallic compound is decomposed to yield the desired film by either photolysis or low temperature pyrolysis or thermolysis, it is permissible to heat the substrate or target surfaces to greater temperatures. These temperatures would not cause the decomposition of the organo-metallic compound, but can be desirable to anneal to deposited film.

The following examples further illustrate the present invention.

EXAMPLE 1

The following reaction was run for three days at room temperature according to a description in the literature.

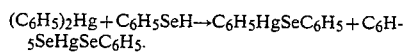

$(C_6H_5)_2Hg + C_6H_5SeH \rightarrow C_6H_5HgSeC_6H_5 + C_6H_5SeHgSeC_6H_5$.

The predominantly white solid was recrystallized from 95% ethanol to give $C_6H_5HgSeC_6H_5$, m.p. 80° C. (lit. m.p. 80° C.). A much smaller yield of the yellow granular solid $C_6H_5SeHgSeC_6H_5$ was isolated.

Into a quartz test tube of about 15 ml volume was placed 0.0498 g of RHgSeR (R=$C_6H_5$). The test tube was nearly filed with CHCl$_3$ and sealed while flushing the top of the tube with nitrogen. The solid material dissolved completely. A blank tube was prepared in the same manner using 0.0339 g of RHgSeR. The blank tube, stored unexposed to light and air, showed no change during the time in which the first tube was photolyzed.

Photolysis was conducted with a broadband low pressure mercury lamp. Photolysis was at room temperature but minor heating of the tube lamp was possible. (The tube was about 0.15 m above the lamp). Photolysis was continued for several days with periodic rotation of the test tube. A brown solid was deposited on the walls of the test tube during the photolysis. At the conclusion of the photolysis the tube was opened, the solid material filtered off and washed with $CHCl_3$ and then ethanol. An X-ray diffraction pattern of the brown solid indicated the presence of mercuric selenide.

EXAMPLE 2

Under a nitrogen blanket, 2.0804 g tellurium powder was reacted overnight with about 12 ml 1.75M phenyllithium in 75:25 benzene:ether. No orange or red coloration should be visible. At this time a slurry of 5.1094 g phenylmercuric chloride in benzene at room temperature is added. An orange solution and an orange solid are produced.

Photolysis of the orange materials (slurry with absolute ethanol) in a quartz flask in the absence of oxygen for several days with a low pressure mercury lamp yielded a brown material. An X-ray powder diffraction pattern of this brown solid had the pattern characteristic of mercury telluride (coloradorite).

EXAMPLE 3

Boiling a slurry of the orange solid of Example 2 for several days in tetrahydrofuran gave a dark solid containing some droplets of mercury. Alternatively, if during the preparation of the orange material, the phenylmercuric chloride was added as a hot benzene solution, a dark brown precipitate was recovered. X-ray diffraction patterns showed that both these solids contained some mercuric telluride.

Obviously, many modifications and variations of the present invention are possible in light of the above teachings. It is, therefore, to be understood that within the scope of the appended claims the invention may be practiced otherwise than as specifically described.

What is claimed is:

1. A method of depositing a film having the formula $A^{IIB}B^{VIA}$, wherein $A^{IIB}$ is a group IIB metal and $B^{VIA}$ is a chalcogenide selected from the group consisting of S, Se and Te, upon a target surface comprising the steps of:

exposing said surface to an environment containing a photolytically decomposable organo-metallic compound, said compound selected from the group consisting of R-X-M-X-R', R-M-X-M-R', R-M-X-R', R-M-CH$_2$-X-R' and R-M-X-X-R' wherein: R and R' are each selected from the group consisting of hydrogen, an alkyl, an aryl and an organic radical containing a heteroatom; M is a group IIB metal; and X is a chalcogenide; and photolytically decomposing said organo-metallic compound to effect deposition of said film upon said surface.

2. The method of claim 1 wherein said organo-metallic compound is the compound Ph-Hg-Se-Ph and the deposited film has the formula HgSe.

3. The method of claim 1 wherein said organo-metallic compound is the compound Ph-Hg-Te-Ph and the deposited film has the formula HgTe.

4. A method of depositing a film having the formula $A^{IIB}B^{VIA}$, wherein $A^{IIB}$ is a group IIB metal and $B^{VIA}$ is a chalcogenide selected from the group consisting of S, Se and Te, upon a target surface comprising the steps of:

exposing said surface to an environment containing a decomposable organo-metallic compound, said compound selected from the group consisting of R-M-X-R', R-M-X-M-R', R-X-M-X-R', R-M-CH$_2$-X-R' and R-M-X-X-R' wherein: R and R' are each selected from the group consisting of hydrogen, an alkyl, an aryl and an organic radical containing a heteroatom; M is a group IIB metal; and X is a chalcogenide; and decomposing said organo-metallic compound by low temperature thermolysis between 50° and 100° C. to effect deposition of said film upon said surface.

5. The method of claim 4 wherein said organo-metallic compound is Ph-Hg-Te-Ph and the deposited film has the formula HgTe.

6. A film on a surface having the formula $A^{IIB}B^{VIA}$, wherein $A^{IIB}$ is a group IIB metal and $B^{VIA}$ is a chalcogenide selected from the group consisting of S, Se and Te, said film produced by the steps of photolytically decomposing an organo-metallic compound to effect deposition of said film upon said surface, said organo-metallic compound selected from the group consisting of R-X-M-X-R', R-M-X-M-R', R-M-X-R', R-M-CH$_2$-X-R' and R-M-X-X-R' wherein R and R' are each selected from the group consisting of hydrogen, an alkyl, an aryl and an organic radical containing a heteroatom; M is a group IIB metal; X is a chalcogenide.

* * * * *